(12) United States Patent
Wu et al.

(10) Patent No.: US 10,613,155 B2
(45) Date of Patent: Apr. 7, 2020

(54) SHORT CIRCUIT TESTING METHOD FOR CAPACITIVE SENSING DEVICE AND THE CAPACITIVE SENSING DEVICE

(71) Applicant: PixArt Imaging Inc., Hsin-Chu (TW)

(72) Inventors: Sung-Han Wu, Hsin-Chu (TW); Wooi Kip Lim, Penang (MY); Kei Tee Tiew, Penang (MY); Keen-Hun Leong, Penang (MY)

(73) Assignee: PixArt Imaging Inc., Hsin-Chu (TW)

( * ) Notice: Subject to any disclaimer, the term of this patent is extended or adjusted under 35 U.S.C. 154(b) by 46 days.

(21) Appl. No.: 15/798,405

(22) Filed: Oct. 31, 2017

(65) Prior Publication Data

US 2018/0313883 A1     Nov. 1, 2018

(30) Foreign Application Priority Data

Apr. 26, 2017  (TW) .............................. 106113868 A

(51) Int. Cl.
| | | |
|---|---|---|
| G01R 31/50 | (2020.01) | |
| G01D 5/24 | (2006.01) | |
| G01R 31/28 | (2006.01) | |
| G06F 3/041 | (2006.01) | |
| G11C 29/02 | (2006.01) | |
| G06F 3/044 | (2006.01) | |
| G09G 3/00 | (2006.01) | |
| G11C 29/50 | (2006.01) | |

(52) U.S. Cl.
CPC .............. G01R 31/50 (2020.01); G01D 5/24 (2013.01); G01R 31/2829 (2013.01); G06F 3/044 (2013.01); G06F 3/0418 (2013.01); G09G 3/006 (2013.01); G11C 29/025 (2013.01); G11C 29/50008 (2013.01)

(58) Field of Classification Search
CPC .............. G01R 31/2829; G01R 31/025; G01R 31/024; G01R 27/14; G01R 31/028; G01R 31/08; G06F 3/044; G06F 2203/04111; G06F 3/0416; G06F 2203/04112; G06F 11/2221; G06F 3/0418; G01D 5/24; G09G 3/006
See application file for complete search history.

(56) References Cited

U.S. PATENT DOCUMENTS

| | | | | |
|---|---|---|---|---|
| 6,873,174 B2* | 3/2005 | Matsunaga | ............ | G09G 3/006 |
| | | | | 324/760.02 |
| 8,604,798 B2* | 12/2013 | Casillan | .................. | G06F 3/044 |
| | | | | 324/511 |
| 8,743,060 B2* | 6/2014 | Hotelling | .............. | G06F 3/0362 |
| | | | | 345/156 |
| 9,110,547 B1* | 8/2015 | Sivertsen | .............. | G06F 3/0418 |
| 9,122,361 B2* | 9/2015 | Shen | ..................... | G06F 3/0418 |
| 9,383,849 B2* | 7/2016 | Hur | ........................ | G06F 3/0412 |
| 9,714,973 B2* | 7/2017 | Guo | ..................... | G01R 31/025 |

* cited by examiner

*Primary Examiner* — Vinh P Nguyen
(74) *Attorney, Agent, or Firm* — Winston Hsu

(57) ABSTRACT

A short circuit testing method for a capacitive sensing device including a plurality of sense lines and a plurality of drive lines includes: under a short circuit testing mode, coupling at least one first line in the sense lines and drive lines to a reference level; using a sensing circuit corresponding to a specific sense line to read out a testing resultant signal; and, comparing the testing resultant signal with a reference signal to determine whether a short circuit exists.

8 Claims, 7 Drawing Sheets

SHORT CIRCUIT TESTING METHOD FOR CAPACITIVE SENSING DEVICE AND THE CAPACITIVE SENSING DEVICE

BACKGROUND OF THE INVENTION

1. Field of the Invention

The invention relates to a testing mechanism, and more particularly to a capacitive sensing device and a corresponding short circuit testing method.

2. Description of the Prior Art

Generally speaking, a conventional scheme is to adopt one capacitor element to perform short circuit test for lines of a capacitive sensing device. The conventional scheme is to use and connect such capacitor element and lines of each sensing cell within a sensing panel of the capacitive sensing device in parallel, to generate a voltage difference for each sensing cell thereby determining whether a short circuit abnormal condition occurs or not. However, it is needed for the conventional scheme to wait a very long testing time period to complete test for lines of multiple sensing cells. Today, such conventional scheme cannot meet a user's requirement.

SUMMARY OF THE INVENTION

Therefore one of the objectives of the invention is to provide a capacitive sensing device and corresponding short circuit testing method, to solve the above mentioned problems.

According to embodiments of the invention, a short circuit testing method of a capacitive sensing device is disclosed. The capacitive sensing device has a plurality of sense lines and a plurality of drive lines. The short circuit testing method comprises: under a short circuit testing mode, coupling at least one first line in the plurality of sense lines and the plurality of drive lines to a reference level; utilizing a sensing circuit corresponding to a specific sense line to read a testing resultant signal; and, comparing the testing resultant signal with a reference signal to determine whether a short circuit condition occurs in the plurality of sense lines and the plurality of drive lines.

According to the embodiments, a capacitive sensing device is further disclosed. The device comprises a plurality of sense lines, a plurality of drive lines, and at least one first switch. The at least first switch is selectively connected to at least one first line in the plurality of sense lines and the plurality of drive lines. Under a short circuit testing mode, the at least one first switch is arranged to couple the at least one first line to a reference level, and a sensing circuit corresponding to a specific sense line is arranged to read a testing resultant signal so as to perform a short circuit test to determine whether a short circuit condition occurs in the plurality of sense lines and the plurality of drive lines by comparing the testing resultant signal with a reference signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
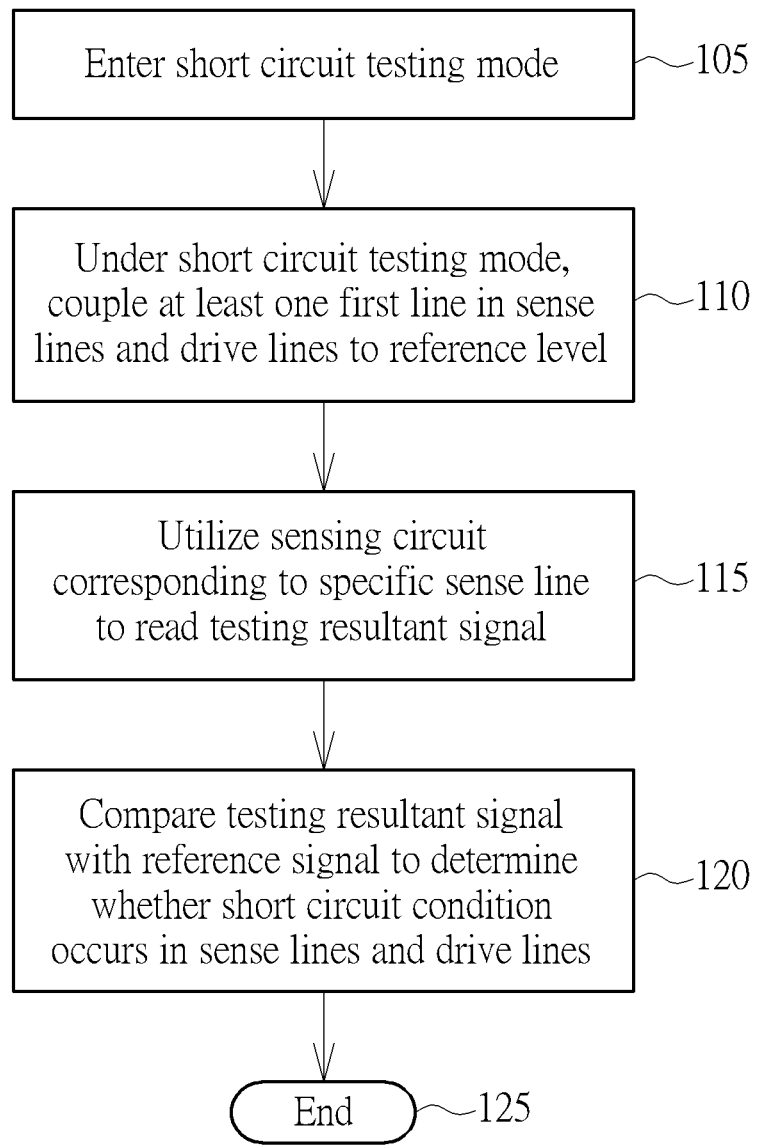
FIG. 1 is a flowchart diagram of a short circuit abnormal testing method of a capacitive sensing device according to embodiments of the invention.

FIG. 1 is a flowchart diagram of a short circuit testing method of a capacitive sensing device according to embodiments of the invention. The capacitive sensing device at least includes a plurality of sense capacitors, a plurality of drive lines coupled to the sense capacitors, and a plurality of sense lines coupled to the sense capacitors. In practice, in different embodiments for performing short circuit abnormal testing upon different lines, the capacitive sensing device for example may further comprises a plurality of drive pads (pads corresponding to the drive lines), a plurality of sense pads (pads corresponding to the sense lines), a plurality of first ESD (Electrostatic Discharge) protection resistors connected to the sense pads, a plurality of second ESD protection resistors connected to the drive pads, a plurality of sensing circuits connected to the first ESD protection resistors (each sensing circuit for example comprises a comparator circuit, a filter, and an analog-to-digital converter), a plurality of sense line switches configured between the sense pads and a reference level, a plurality of drive line switches configured between the drive pads and a reference level, and/or at least plurality of internal switches respectively connected to different sense lines and different drive lines. The reference level for example is a ground level (but not limited).

The capacitive sensing device can be arranged to utilize the short circuit testing method to perform short circuit test upon internal circuits/lines to know/detect whether a short circuit condition occurs, to detect the quality of sensors (e.g. touch control sensors) of the capacitive sensing device. Specifically, the short circuit testing method can be arranged to perform test to determine whether two drive lines are shorted, determine whether two sense lines are shorted, and/or to determine whether a drive line is shorted to a sense line. In addition, it is only required to utilize internal circuit elements (e.g. resistors, capacitors, or other circuit elements) within the capacitive sensing device to implement the short circuit testing method, but an additional testing circuit/equipment is not necessary. Compared to the conventional scheme, the embodiments of the invention provide a low cost test solution.

It should be noted that each of the drive lines and each of the sense lines can be regarded as lines to be tested or called lines under test (i.e. devices/units under test) before tested by the short circuit testing method, i.e. a drive line under test and a sense line under test. The short circuit testing method is arranged to test all drive lines and all sense lines, to detect whether a short circuit condition occurs. Provided that substantially the same result is achieved, the steps of the flowchart shown in FIG. 1 need not be in the exact order shown and need not be contiguous, that is, other steps can be intermediate. Steps are detailed in the following:

Step 105: enter a short circuit testing mode;

Step 110: under the short circuit testing mode, couple at least one first line in the sense lines and the drive lines to a reference level Vref such as a ground level (but not limited);

Step 115: utilize a sensing circuit corresponding to a specific sense line to read a testing resultant signal;

Step 120: compare the testing resultant signal with a reference signal to determine whether a short circuit condition occurs in the sense lines and the drive lines wherein the reference signal can be a reference direct-current level or a reference alternating-current signal; and Step 125: End.

In addition, it should be noted that the specific sense line may indicate a sense line under test and/or a particular sense line which is used for reading or accessing the testing resultant signal. For example, if it is to test two sense lines under test, the above-mentioned testing resultant signal can be read and obtained by using a sensing circuit corresponding to one of the two sense lines under test; that is, such sense line under test is the specific sense line. Alternatively, if it is to test a sense line under test and a drive line under test, the above-mentioned testing resultant signal can be read and obtained by using a sensing circuit corresponding to the sense line under test; that is, the sense line under test is the specific sense line. Alternatively, if it is to test two drive lines under test, the above-mentioned testing resultant signal can be read and obtained by using a sensing circuit corresponding to a certain/particular sense line which can be regarded as the specific sense line.

In addition, when the capacitive sensing device is under the short circuit testing mode, the reference signal can be a reference direct-current (DC) level or a reference alternating-current (AC) signal. When the reference AC signal is adopted to implement the reference signal, the short circuit testing mode is regarded as a short circuit AC testing mode. When the reference DC level is adopted to implement the reference signal, the short circuit testing mode is regarded as a short circuit DC testing mode.

In the embodiments of the invention, the short circuit testing mode can be arranged to test a short circuit condition of drive lines and/or sense lines. The embodiments of testing short circuit condition of different lines are described in the following paragraphs.

For example, when it is to measure and test whether a short circuit condition occurs in two sense lines under test, the method is arranged to couple the specific sense line (i.e. a sense line under test) to the reference level such as the ground level, and also couple at least another sense line in the sense lines excluding the specific sense line to the reference level. For instance, the method is arranged to couple a certain sense line which is regarded as another sense line under test to the reference level. The method then is arranged to read and obtain a testing resultant signal from the sensing circuit corresponding to the specific sense line, and to compare the testing resultant signal with the reference signal (reference DC level or reference AC signal) to determine whether the specific sense line is shorted to the another sense line under test. The implementation is shown by FIG. 2.

Figure 2:
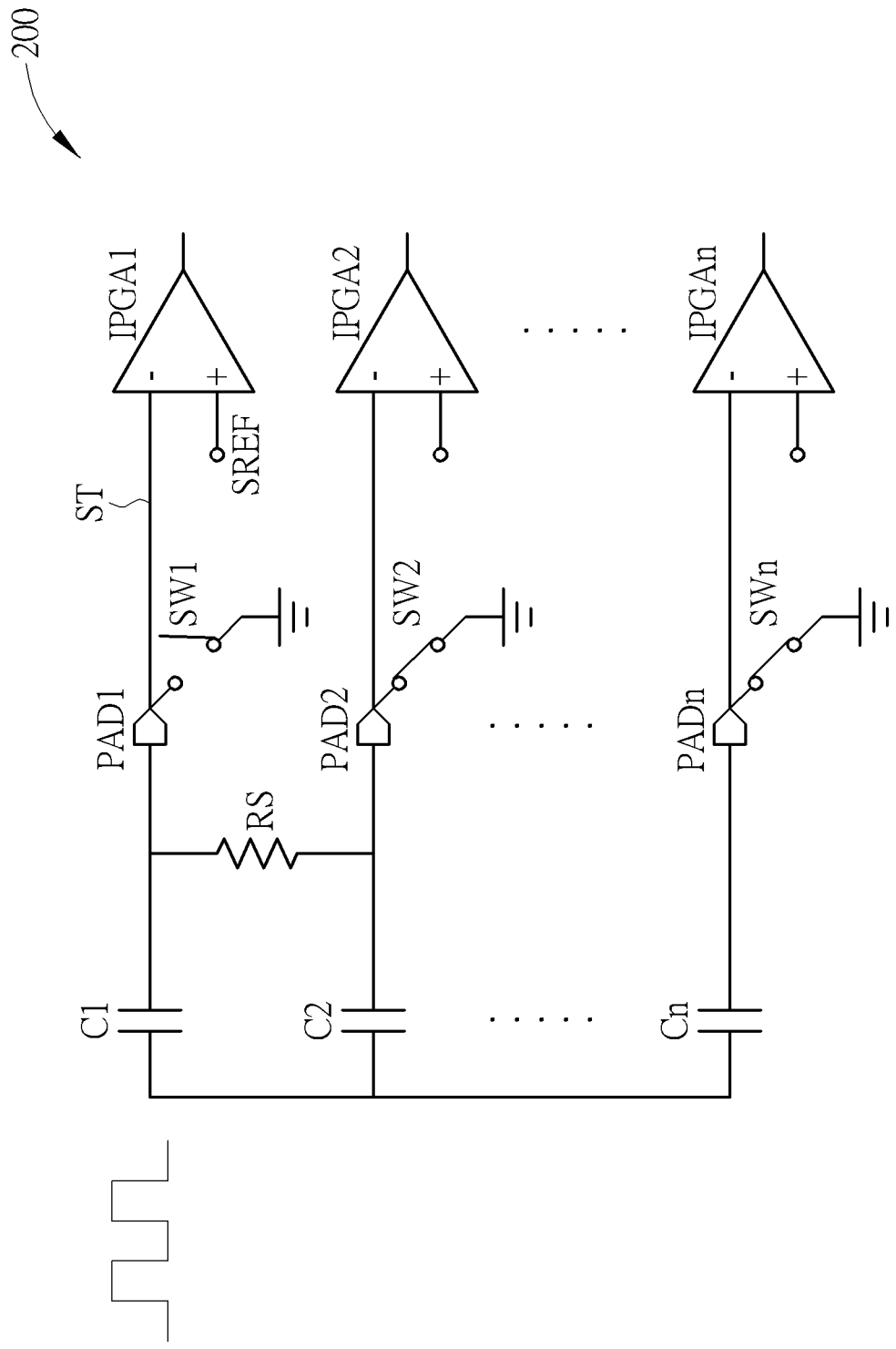
FIG. 2 is an embodiment diagram of a capacitive sensing device performing test upon two sense lines under test to detect whether a short circuit condition occurs.

FIG. 2 is an embodiment diagram of a capacitive sensing device 200 performing test upon two sense lines under test to detect whether a short circuit condition occurs. As shown in FIG. 2, the capacitive sensing device 200 comprises a drive line (not shown in FIG. 2), sense capacitors C1-Cn, a plurality of sense lines SL1-SLn, a plurality of sense pads PAD1-PADn, a plurality of comparator circuits IPGA1-IPGAn of a plurality of sensing circuits respectively corresponding to the sense lines SL1-SLn, and a plurality of switches SW1-SWn (configured between the sense pads PAD1-PADn and the ground level) respectively corresponding to the sense lines SL1-SLn. It should be noted that each drive line and each sense line are associated with one sense capacitor (cell). The embodiment of FIG. 2 shows an example of one drive line. Each sense line has merely one sense capacitor.

When measuring and testing whether the sense lines SL1 and SL2 are shorted, the capacitive sensing device 200 is arranged to turn on or enable the comparator circuit IPGA1 of the sensing circuit corresponding to the sense line such as sense line SL1 and turn off or disable comparator circuits IPGA2-IPGAn of the other sensing circuits. The device 200 also electrically connects the other sense lines (excluding the sense line SL1) to the ground level, to make the level of the corresponding sense pad be a low logical level. The device 200 also uses the comparator circuit IPGA1 to read the testing resultant signal ST; that is, the sense line SL1 is the above-mentioned specific sense line. Also, the capacitive sensing device 200 is arranged to make the switch SW1 be open and the other switches SW2-SWn be closed and connected to the reference level such as ground level.

In the embodiment, the device 200 employs a reference AC signal SREF as the reference signal which is to be compared with the testing resultant signal ST. The comparator circuit IPGA1 in this situation reads and obtains the testing resultant signal ST which has an AC signal. The comparator circuit IPGA1 is arranged to compare a peak-to-peak amplitude of the AC signal in the testing resultant signal ST with a peak-to-peak amplitude of the reference AC signal SREF. If the sense lines SL1 and SL2 actually are not shorted, this indicates that the short circuit resistor RS as shown in FIG. 2 does not occur, and the peak-to-peak amplitude of the testing resultant signal ST will not be changed and not become substantially different due to the short circuit resistor RS connected to the ground level. In practice, if the difference of the two peak-to-peak amplitudes is smaller than a specific threshold value, this may indicate that the two peak-to-peak amplitudes are substantially identical, i.e. not different.

Instead, if the sense lines SL1 and SL2 are shorted, this indicates that the short circuit resistor RS as shown in FIG. 2 occurs, and the peak-to-peak amplitude of the testing resultant signal ST will be changed and become substantially different due to the short circuit resistor RS connected to the ground level. Thus, when detecting that the peak-to-peak amplitude of the testing resultant signal ST is different from the peak-to-peak amplitude of reference AC signal SREF, the short circuit testing method of capacitive sensing device 200 can decide that a short circuit condition has occurred in the sense lines and the drive lines; that is, the sense lines SL1 and SL2 are shorted. Instead if the above two peak-to-peak amplitudes are substantially identical, the method can decide that the sense line SL1 is not shorted to the sense line SL2.

The above operations and mechanism can be applied to detecting whether any two sense lines are shorted or not.

Detecting whether sense lines SL1 and SL2 are shorted is not intended to be a limitation.

Further, the capacitive sensing device 200 can also select the sense line SL2 as the specific sense line, and read the testing resultant signal by using a corresponding sensing circuit of the comparator circuit IPGA2. Also, the capacitive sensing device 200 is arranged to control the switch SW2 at an open state and control other switches SW1 and SW3-SWn at a closed state and connected to the reference level such as the ground level. Accordingly, the device 200 can be arranged to detect and determine whether the sense line SL2 is shorted to an adjacent sense line such as sense line SL1 or sense line SL3. If it is to determine whether the sense line SL1 is shorted to the sense line SL2, the method can be arranged to select one of the sense lines SL1 and SL2 as a specific sense line, select at least one of other sense lines excluding the sense lines SL1 and SL2 as another specific sense line, and refer to two test results of the two specific sense lines and determine whether the sense line SL1 is shorted to the sense line SL2 according to the two test results.

Similarly, if it is to determine whether the sense line SL2 is shorted to the sense line SL3, the method can be arranged to select one of the sense lines SL2 and SL3 as a specific sense line, select at least one of other sense lines excluding the sense lines SL2 and SL3 as another specific sense line, and refer to two test results of the two specific sense lines and determine whether the sense line SL2 is shorted to the sense line SL3 according to the two test results.

Further, the above reference level is not limited as the ground level. Any DC levels are appropriate to be used as the reference level.

Figure 3:
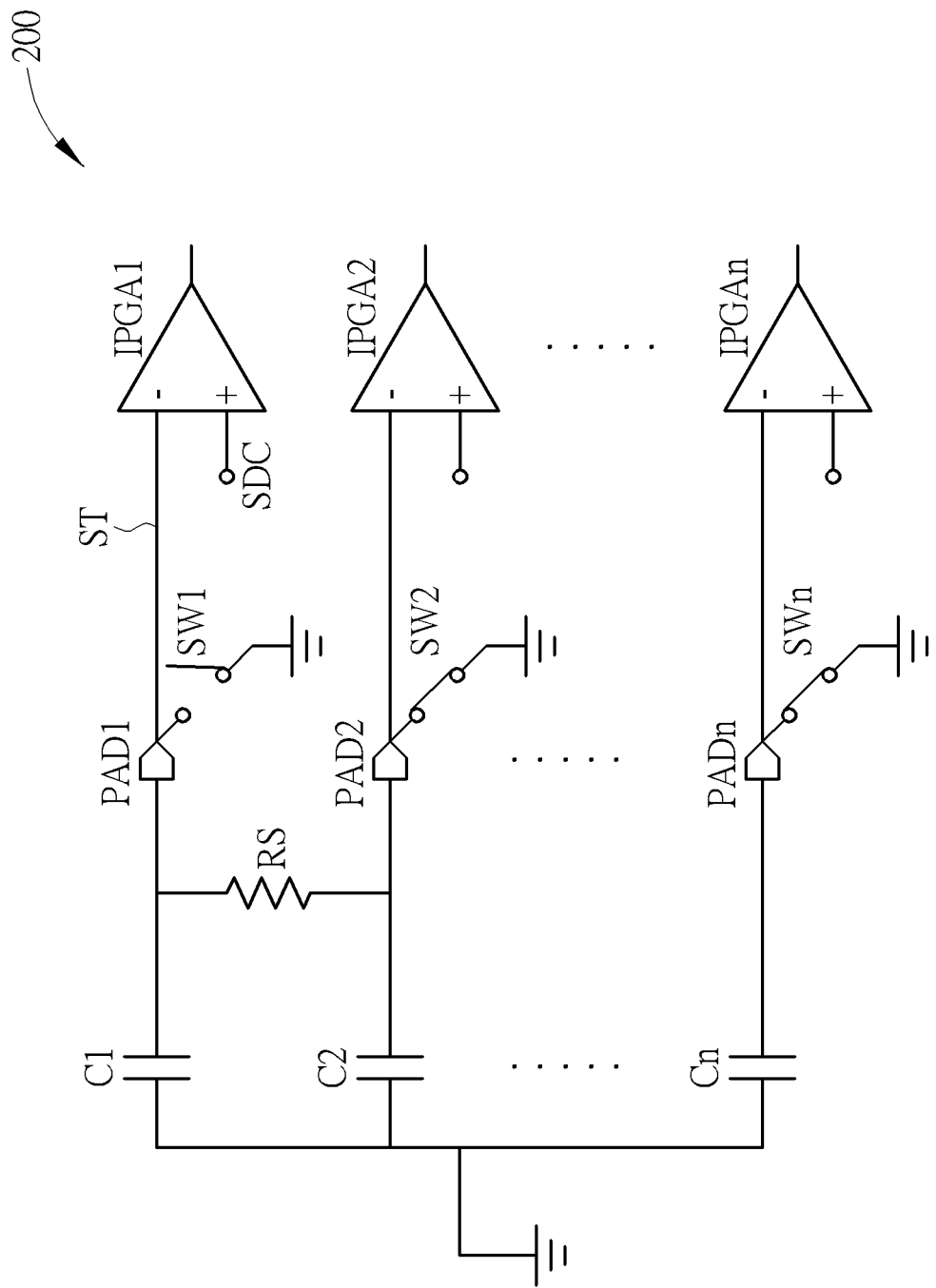
FIG. 3 is another embodiment diagram of capacitive sensing device performing test upon two sense lines under test to detect whether a short circuit condition occurs.

Further, in other embodiments, a reference DC level SDC can be also used as the reference signal to be compared with the testing resultant signal ST. FIG. 3 is another embodiment diagram of capacitive sensing device 200 performing test upon two sense lines under test to detect whether a short circuit condition occurs. As shown in FIG. 3, one terminal of each of the sense capacitors C1-Cn are is connected to the ground level, and the comparator circuit IPGA1 reads the testing resultant signal ST which has a DC level. The comparator circuit IPGA1 is arranged to compare the DC level of testing resultant signal ST with the reference DC level SDC. The test result of each sense line has a predetermined divided voltage level range. If the sense lines SL1 and SL2 are not shorted, this indicates that the short circuit resistor RS of FIG. 3 does not occur, and the DC level of testing resultant signal ST will not be changed and not become an over high voltage level due to short circuit resistor RS connected to the ground level. The predetermined divided voltage level range of the test result of sense line SL1 can be utilized for determining whether the DC level become an over high voltage level. If the DC level exceeds above the predetermined divided voltage level range, this can determine that the DC level become an over high voltage level.

Instead, if the sense lines SL1 and SL2 are shorted actually, this indicates that short circuit resistor RS of FIG. 3 occurs, and the DC level of testing resultant signal ST will be changed and become an over high voltage level to be substantially different due to short circuit resistor RS connected to the ground level. Accordingly, when detecting that the DC level of testing resultant signal ST is different from the reference DC level SDC, the short circuit testing method of capacitive sensing device 200 is arranged to decide that a short circuit condition has occurred in the sense lines and the drive lines; that is, the sense lines SL1 and SL2 are shorted. If the above two DC levels are substantially identical, the method can decide that the sense lines SL1 and SL2 are not shorted.

It should be noted that the above operations and mechanism can be applied to detect whether any two sense lines are shorted or not. Detecting whether the sense lines SL1 and SL2 are shorted is not intended to be a limitation.

Figure 4:
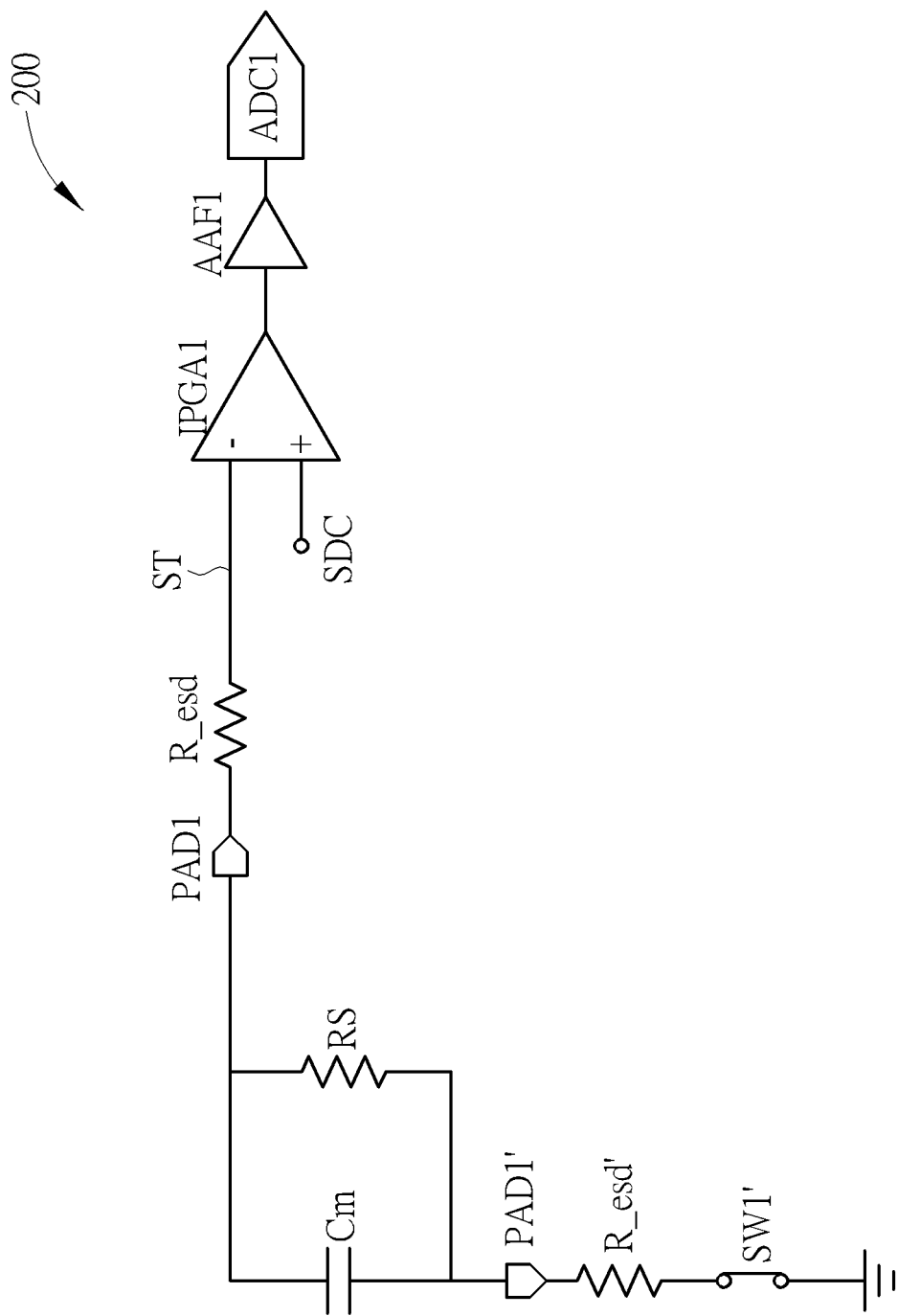
FIG. 4 is an embodiment diagram of capacitive sensing device performing test upon a sense line under test and a drive line under test to detect whether the sense line under test is shorted to the drive line under test.

FIG. 4 is an embodiment diagram of capacitive sensing device 200 performing test upon a sense line under test and a drive line under test to detect whether the sense line under test is shorted to the drive line under test. For example, in the embodiment, the capacitive sensing device 200 is arranged to measure, test, and detect whether a sense line under test SL1 is shorted to a drive line under test DL1. A sense capacitor Cm is generated between the sense line under test SL1 and drive line under test DL1 due to that SL1 becomes electrically coupled to DL1. The sense line under test SL1 and drive line under test DL1 respectively correspond to pads PAD1, PAD1' and ESD protection resistors R_esd, R_esd'. The switch SW1' is configured and placed between the ESD protection resistor Resd' and ground level. The ESD protection resistor Resd is connected to comparator circuit IPGA1, anti-aliasing filter AAF1, and analog-to-digital converter ADC1 of corresponding sensing circuit. For instance, when detecting whether the sense line SL1 is shorted to the drive line DL1, the capacitive sensing device 200 is arranged to control the switch SW1' to be closed and read the testing resultant signal ST by using the comparator circuit IPGA1 of the corresponding sensing circuit. That is, the sense line SL1 is regarded as the above mentioned specific sense line.

In the embodiment, the method employs the reference DC level SDC as the reference signal to compare the reference DC level SDC with the DC level of testing resultant signal ST. The comparator circuit IPGA1 is arranged to compare the DC level of testing resultant signal ST with the reference DC level SDC. If the sense line SL1 is not shorted to the drive line DL1 actually, this indicates that the short circuit resistor RS will not occur on FIG. 4, and the DC level of testing resultant signal ST will not be changed and will not connected to a ground level to become an over high voltage level due to the short circuit resistor RS. Instead, if the sense line SL1 is actually shorted to the drive line DL1, this indicates that the short circuit resistor RS occurs on FIG. 4, and the DC level of testing resultant signal ST will be changed and will be connected to the ground level to become an over high voltage level and substantially different due to the short circuit resistor RS. Accordingly, when detecting that the DC level of testing resultant signal ST is different from the reference DC level SDC, the short circuit testing method of capacitive sensing device 200 can decide that a short circuit condition has occurred in the sense lines and the drive lines; the sense line SL1 has shorted to the drive line DL1. Instead, if the above two DC levels are substantially identical, the method can decide that the sense line SL1 is not shorted to the drive line DL1. It should be noted that the above operations and mechanism can be applied to detect and determine whether any one sense line is shorted to any one drive line. Detecting whether the sense line SL1 is shorted to the drive line DL1 is not intended to be a limitation. In addition, the reference DC level SDC can be configured as the ground level in another embodiment.

Figure 5:
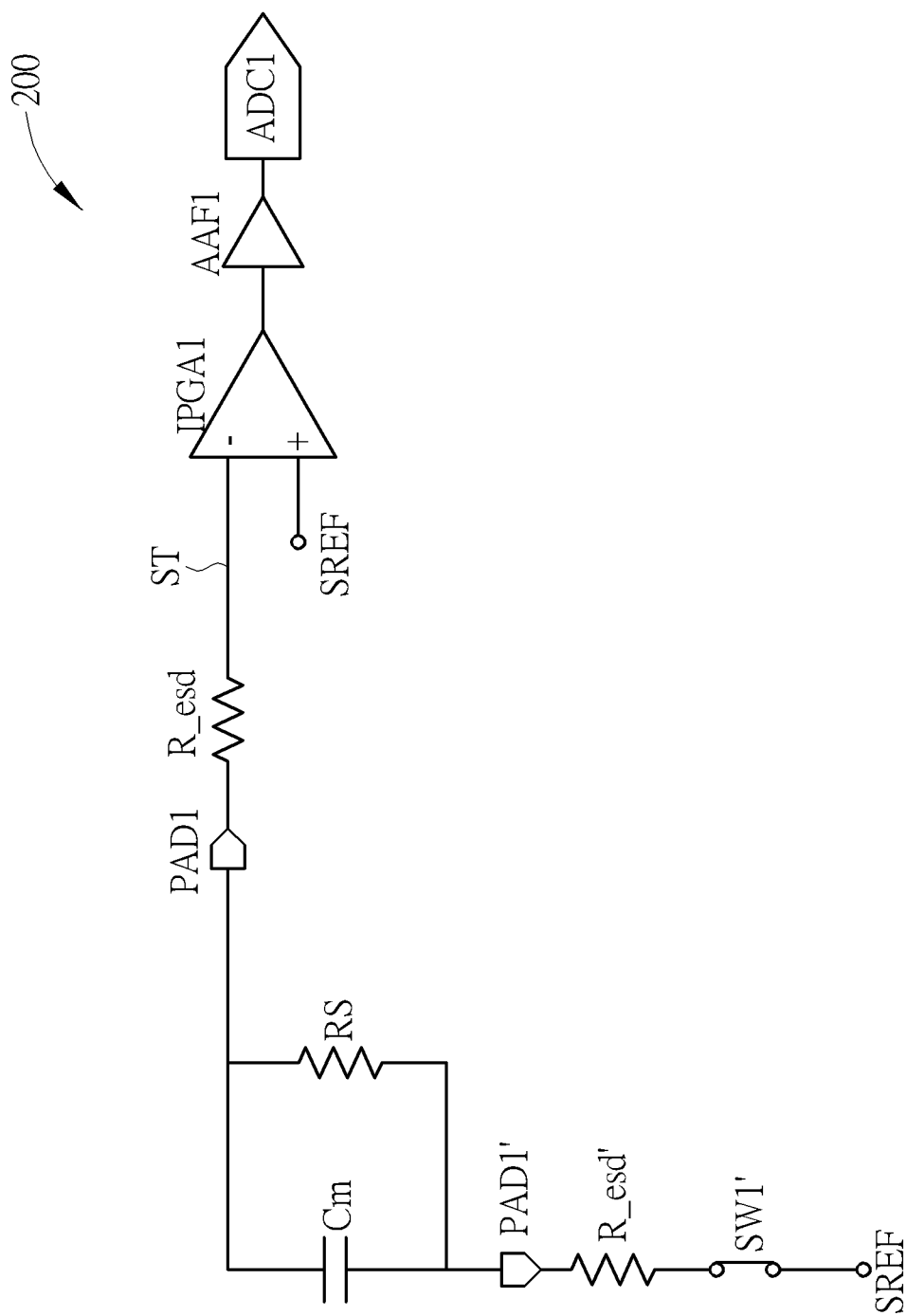
FIG. 5 is another embodiment diagram of capacitive sensing device performing test upon a sense line under test and a drive line under test to detect whether the sense line under test is shorted to the drive line under test.

Further, the reference signal of FIG. 4 can be implemented by using the reference AC signal SREF. For example, as shown in FIG. 5, the switch SW1' is configured and placed between the ESD protection resistor Resd' and the reference AC signal SREF. When detecting whether the sense line SL1 is shorted to the drive line DL1, the capacitive sensing device 200 can be arranged to control the switch SW1' to be closed and read the testing resultant signal ST by using the comparator circuit IPGA1 of a corresponding sensing circuit. The sense line SL1 can be regarded as the above specific sense line. In this embodiment, the method employs the reference AC signal SREF as the reference signal to compare the reference AC signal SREF with testing resultant signal ST. The comparator circuit IPGA1 is arranged to compare the peak-to-peak amplitude of testing resultant signal ST with the peak-to-peak amplitude of reference AC signal SREF. If the sense line SL1 is not shorted to the drive line DL1 actually, this indicates that short circuit resistor RS will not occur on FIG. 5, and the peak-to-peak amplitude of testing resultant signal ST will not be changed and not become substantially different due to short circuit resistor RS. Instead, if the sense line SL1 and drive line DL1 are shorted actually, this indicates that short circuit resistor RS occurs on FIG. 5, and the peak-to-peak amplitude of testing resultant signal ST will be changed and become substantially different due to short circuit resistor RS. Accordingly, when detecting that the peak-to-peak amplitude of testing resultant signal ST is different from that of reference AC signal SREF, the short circuit testing method of capacitive sensing device 200 can decide that a short circuit condition has occurred in the sense lines and the drive lines; the sense line SL1 is shorted to drive line DL1. Instead, if the above two peak-to-peak amplitudes are substantially identical, the method can decide that the sense line SL1 is not shorted to drive line DL1. The above operations and mechanism can be also applied to detect and determine whether any one sense line is shorted to any one drive line. Detecting whether sense line SL1 is shorted to drive DL1 is not intended to be a limitation.

Figure 6:
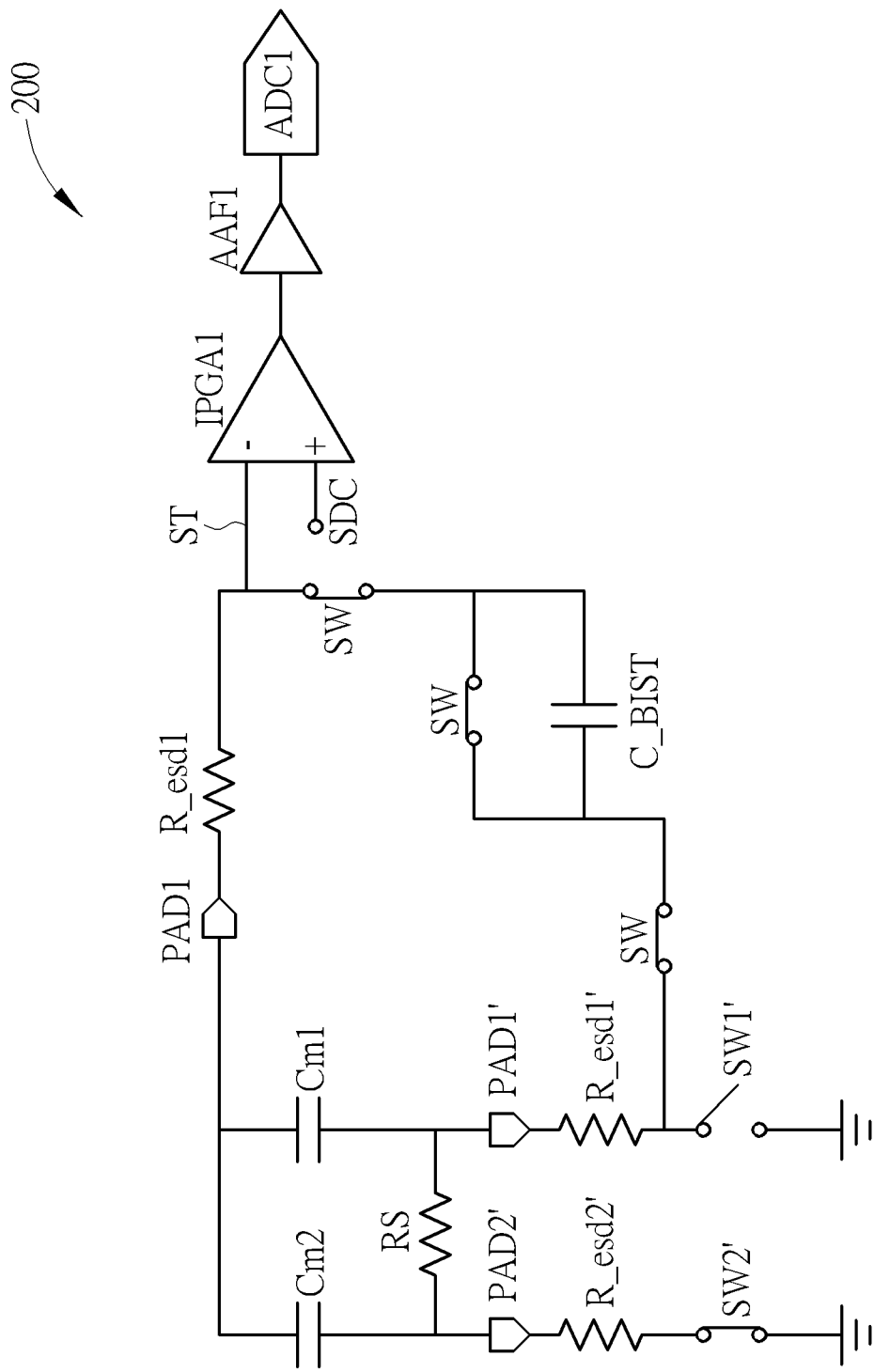
FIG. 6 is an embodiment diagram of capacitive sensing device performing short circuit test upon any two drive lines under test.

FIG. 6 is an embodiment diagram of capacitive sensing device 200 performing short circuit test upon any two drive lines under test. For example, as shown in FIG. 6, for detecting whether drive lines DL1 and DL2 are shorted, the method can select the drive line DL1 as a drive line under test, and the drive line DL2 is one of other drive lines excluding the drive line DL1. Cm1 and Cm2 are corresponding sense capacitors. PAD1 is a sense pad on the sense line SL1, and PAD1' and PAD2' are respective drive pads on drive lines DL1 and DL2. R_esd1, R_esd1', and R_esd2 are ESD protection resistors. C_BIST is an internal capacitor within the capacitive sensing device 200. Switches SW1' and SW2' are respectively corresponding to drive lines DL1 and DL2. SW means switches within the capacitive sensing device 200 and are connected between drive line DL1 and sense line SL1. FIG. 6 shows three switches SW. In other embodiment, only one, two, or other number of internal switches can be used for implementation. This is not intended to be a limitation. The capacitive sensing device 200 is arranged to measure and detect whether the drive line under test DL1 is shorted to the other drive lines. Under the short circuit testing mode, the capacitive sensing device 200 is arranged to control the switch SW1' corresponding to the drive line under test DL1 to be open, to disconnect the connection between the corresponding ESD protection resistor R_esd1' and the ground level. Also, the device 200 is arranged to control switches corresponding to at least one of the other drive lines to be closed. For example, the device 200 control switch SW2' to be closed, to connect the corresponding ESD protection resistor R_esd2' to the ground level. Also, the capacitive sensing device 200 is arranged to turn on or enable a comparator circuit such as comparator circuit IPGA1 of a sensing circuit corresponding to the sense line SL1. The sense line SL1 is regarded as the above-mentioned specific sense line. In addition, the capacitive sensing device 200 is also arranged to control at least one of switches SW connected between the specific sense line SL1 and drive line under test DL1 to be closed.

The comparator circuit IPGA1 in this situation reads the testing resultant signal ST which includes a DC level. The comparator circuit IPGA1 is arranged to compare the DC level of testing resultant signal ST with the reference DC level SDC. If the drive line under test DL1 actually is not shorted to any one drive line such as DL2, this indicates that short circuit resistor RS will not occur on FIG. 6, and the DC level of testing resultant signal ST will not be changed and will not be connected to the ground level via switch SW2' to become an over high voltage level due to short circuit resistor RS. Instead, if the two drive lines DL1 and DL2 are shorted actually, this indicates that the short circuit resistor RS occurs on FIG. 6, and the DC level of testing resultant signal ST will be changed and will be connected to the ground level via switch SW2' to become an over high voltage level and substantially different due to short circuit resistor RS. Accordingly, when detecting that DC level of testing resultant signal ST is different from reference DC level SDC, the short circuit testing method of capacitive sensing device 200 can decide that a short circuit condition has occurred in the sense lines and drive lines; the drive lines DL1 and DL2 are shorted. Instead, if the above-mentioned two DC levels are substantially identical, the method can decide that drive lines DL1 and DL2 are not shorted. The above operations and mechanism can be also applied to detect and determine whether any two drive lines are shorted or not. Detecting whether the two drive lines DL1 and DL2 is not intended to be a limitation.

Figure 7:
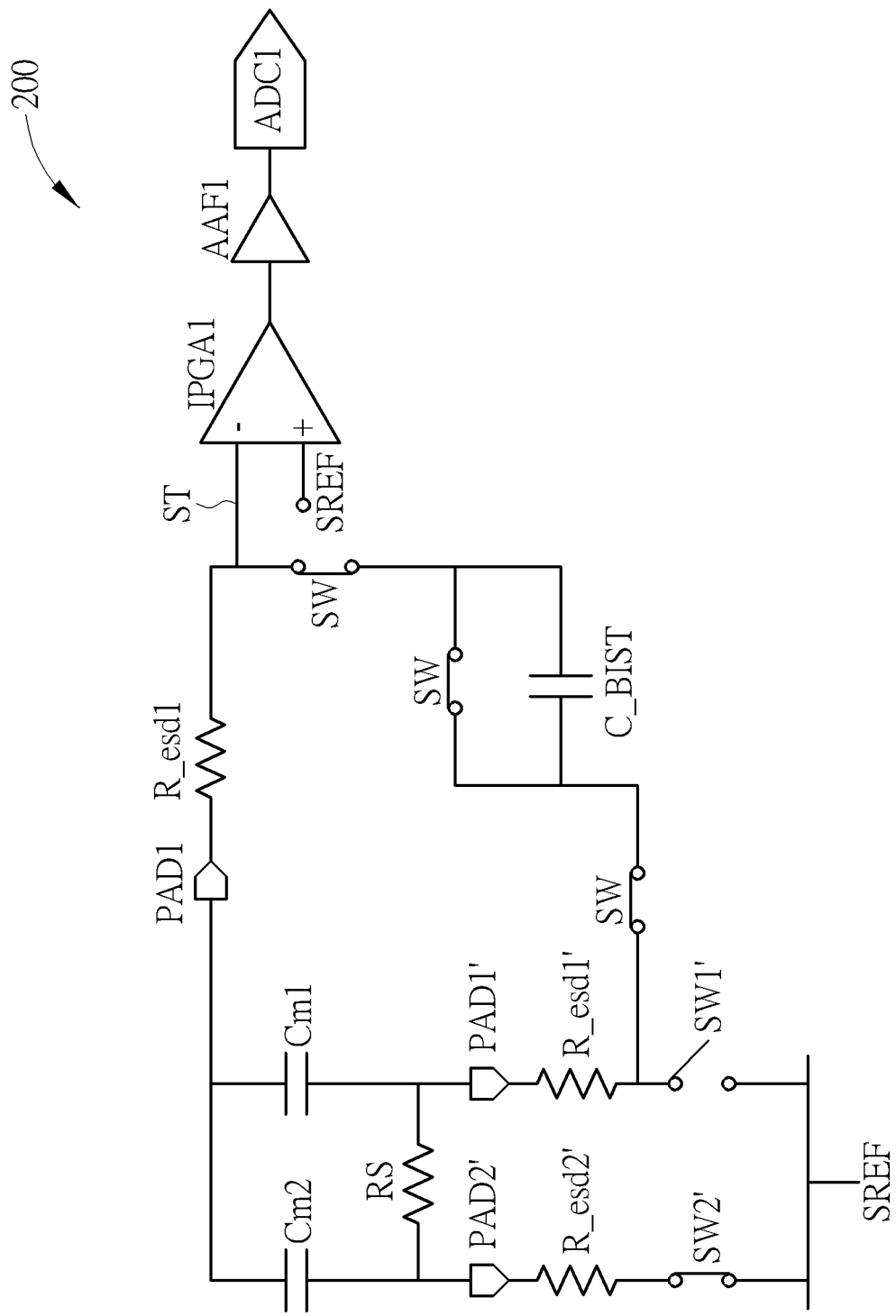
FIG. 7 is another embodiment diagram of capacitive sensing device performing short circuit test upon any two drive lines under test.

Further, the method can employ the reference AC signal SREF to implement the reference signal of FIG. 6. FIG. 7 is another embodiment diagram of capacitive sensing device 200 performing short circuit test upon any two drive lines under test. As shown in FIG. 7, the switch SW1' is configured and placed between the ESD protection resistor R_esd1' and reference AC signal SREF. The switch SW2' is configured and placed between the ESD protection resistor R_esd2' and reference AC signal SREF. When detecting whether the drive lines DL1 and DL2 are shorted, the capacitive sensing device 200 is arranged to control the switch SW1' to be open, to disconnect the connection between the corresponding ESD protection resistor R_esd1' and reference AC signal SREF. Also, the device 200 controls at least one of other switches on drive lines to be closed. For example, the device 200 controls switch SW2' to be closed, to connect one end of ESD protection resistor R_esd2' to the reference AC signal SREF. Also, the capacitive sensing device 200 is arranged to turn on or enable a comparator circuit such as IPGA1 of a sensing circuit corresponding to the sense line SL1. In this situation, the sense line SL1 is regarded as the specific sense line. Also, the capacitive sensing device 200 controls at least one of switches SW between the specific sense line SL1 and drive line under test DL1 to be closed.

The comparator circuit IPGA1 in this situation reads the testing resultant signal ST which includes an AC signal. The comparator circuit IPGA1 is arranged to compare the peak-to-peak amplitude of testing resultant signal ST with that of reference AC signal SREF. If the drive line under test DL1 actually is not shorted to any one drive line such as DL2, this indicates that short circuit resistor RS will not occur on FIG. 7, and the peak-to-peak amplitude of testing resultant signal ST will not be changed and will not become substantially different due to short circuit resistor RS. Instead, if the two drive lines DL1 and DL2 are actually shorted, this indicates that short circuit resistor RS as shown in FIG. 7 will occur, and the peak-to-peak amplitude of testing resultant signal ST will be changed and will become substantially different due to short circuit resistor RS. Accordingly, when detecting that the peak-to-peak amplitude of testing resultant signal ST is different from that of reference AC signal SREF, the short circuit testing method of capacitive sensing device 200 can decide that a short circuit condition occurs in the sense lines and drive lines; the drive lines DL1 and DL2 are shorted. Instead, if the above-mentioned two peak-to-peak amplitudes are substantially identical, the method can decide that the drive lines DL1 and DL2 are not shorted. The above operations and mechanism can be also applied to detect and determine whether any two drive lines are shorted or not. Detecting whether the drive lines DL1 and DL2 are shorted is not intended to be a limitation.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A short circuit testing method of a capacitive sensing device, the capacitive sensing device having a plurality of sense pads to be used for reading signals at a plurality of sense capacitors respectively, the plurality of sense pads at least comprising a first sense pad and a second sense pad which are respectively coupled to different sense capacitors, and the short circuit testing method comprises:
   under a short circuit testing mode, coupling the first sense pad to a reference voltage level;
   utilizing a sensing circuit corresponding to the second sense pad to read a testing resultant signal generated from the second sense pad when the first sense pad has been coupled to the reference voltage level, the second sense pad being different from the first sense pad; and
   using a comparator circuit of the sensing circuit to compare the testing resultant signal with a reference signal to determine whether a short circuit condition occurs.

2. The short circuit testing method of claim 1, wherein the step of determining whether the short circuit condition occurs comprises:
   comparing the testing resultant signal with the reference signal to determine whether the second sense pad is shorted to the first sense pad.

3. The short circuit testing method of claim 1, wherein the testing resultant signal has a direct-current level, the reference signal is a reference direct-current level, and the step of determining whether the short circuit condition occurs comprises:
   deciding that the short circuit has occurred when detecting that the direct-current level of the testing resultant signal is different from the reference direct-current level.

4. The short circuit testing method of claim 1, wherein the testing resultant signal is an alternating-current signal, and the reference signal is a reference alternating-current signal; and, the step of determining whether the short circuit condition occurs comprises:
   deciding that the short circuit has occurred when detecting that a peak-to-peak amplitude of the testing resultant signal is different from a peak-to-peak amplitude of the reference alternating-current signal.

5. A capacitive sensing device, comprising:
   a plurality of sense pads at least comprising a first sense pad and a second sense pad, the plurality of sense pads to be respectively used for reading signals of a plurality of sense capacitors, the first sense pad and the second sense pad to be respectively coupled to different sense capacitors; and
   a first switch, selectively connected to the first sense pad;
   wherein under a short circuit testing mode, the first switch is arranged to couple the first pad to a reference voltage level, and a sensing circuit corresponding to the second sense pad is arranged to read a testing resultant signal generated from the second sense pad so as to perform a short circuit test to determine whether a short circuit condition occurs by using a comparator circuit of the sensing circuit for comparing the testing resultant signal with a reference signal, the second sense pad being different from the first sense pad.

6. The capacitive sensing device of claim 5, wherein; under the short circuit testing mode, the first switch is arranged to couple the first sense pad to the reference voltage level so that the short circuit test is performed by comparing the testing resultant signal with the reference signal to determine whether the second sense pad is shorted to the first sense pad.

7. The capacitive sensing device of claim 5, wherein the testing resultant signal has a direct-current level, and the reference signal is a reference direct-current level; and, it is determined that the short circuit has occurred when detecting that the direct-current level of the testing resultant signal is different from the reference direct-current level.

8. The capacitive sensing device of claim 5, wherein the testing resultant signal is an alternating-current signal, and the reference signal is a reference alternating-current signal; and, it is determined that the short circuit has occurred when detecting that a peak-to-peak amplitude of the testing resultant signal is different from a peak-to-peak amplitude of the reference alternating-current signal.

* * * * *